(12) United States Patent
Nien et al.

(10) Patent No.: US 12,538,527 B2
(45) Date of Patent: Jan. 27, 2026

(54) ELECTRONIC DEVICE INCLUDING BONDING STRUCTURE AND METHOD OF MANUFACTURING THE SAME

(71) Applicant: InnoLux Corporation, Miao-Li County (TW)

(72) Inventors: Chueh-Yuan Nien, Miao-Li County (TW); Chao-Chin Sung, Miao-Li County (TW); Chao-Sen Yang, Miao-Li County (TW); Chien-Tzu Chu, Miao-Li County (TW); Yu-Chien Kao, Miao-Li County (TW); Li-Wei Sung, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 558 days.

(21) Appl. No.: 17/932,728

(22) Filed: Sep. 16, 2022

(65) Prior Publication Data

US 2023/0123605 A1 Apr. 20, 2023

(30) Foreign Application Priority Data

Oct. 20, 2021 (CN) .......................... 202111219132.X

(51) Int. Cl.
*H10D 30/67* (2025.01)
*H10D 30/01* (2025.01)

(52) U.S. Cl.
CPC ....... *H10D 30/6758* (2025.01); *H10D 30/031* (2025.01)

(58) Field of Classification Search
CPC .......................... H10D 30/6758; H10D 30/031
USPC ....................................................... 257/288
See application file for complete search history.

(56) References Cited

U.S. PATENT DOCUMENTS

| 9,129,869 | B2 | 9/2015 | Fay et al. | |
|---|---|---|---|---|
| 10,065,808 | B2 | 9/2018 | Ohno et al. | |
| 2005/0155790 | A1* | 7/2005 | Ishizaki | H05K 3/3452 257/E21.503 |
| 2016/0332826 | A1* | 11/2016 | Ohno | H10K 71/00 |
| 2020/0328269 | A1* | 10/2020 | Shin | H10K 59/124 |

FOREIGN PATENT DOCUMENTS

| CN | 104425319 B | 12/2019 |
|---|---|---|
| TW | 201411796 A | 3/2014 |

OTHER PUBLICATIONS

Chinese language office action dated Jun. 26, 2023, issued in application No. TW 111118889.

* cited by examiner

*Primary Examiner* — Eric W Jones
*Assistant Examiner* — Colin Russell Mccutcheon
(74) *Attorney, Agent, or Firm* — McClure, Qualey & Rodack, LLP

(57) ABSTRACT

A method of manufacturing an electronic device is provided. The method includes the following steps: providing a substrate; forming a thin-film transistor layer on the substrate; forming a first passivation layer on the substrate; forming an organic layer on the substrate; patterning the organic layer to expose a first region; forming a second passivation layer on the substrate; patterning the first passivation layer to expose a second region; forming a bonding pad on the substrate, wherein the bonding pad corresponds to an overlapping area of the first region and the second region; and bonding an electronic component to the bonding pad. An electronic device manufactured by the method is also provided.

4 Claims, 10 Drawing Sheets

ELECTRONIC DEVICE INCLUDING BONDING STRUCTURE AND METHOD OF MANUFACTURING THE SAME

CROSS REFERENCE TO RELATED APPLICATIONS

This application claims the benefit of China Application No. 202111219132.X, filed Oct. 20, 2021, the entirety of which is incorporated by reference herein.

BACKGROUND

Technical Field

The present disclosure is related to a method of manufacturing an electronic device, and in particular it is related to a manufacturing method that can improve the structural reliability of an electronic device and an electronic device formed by the manufacturing method.

Description of the Related Art

Electronic products including display panels, such as tablet computers, notebook computers, smartphones, monitors, and televisions, have become indispensable necessities in modern society. With the flourishing development of various electronic products, consumers have high expectations for the quality, function, or price of these products.

Electronic components in an electronic device are usually bonded or electrically connected to a substrate through bonding pads, solder pads or other conductive elements. However, due to the difference in coefficient of thermal expansion (CTE) between the substrate and the light-emitting element, when the temperature changes, the junction between the substrate and the light-emitting element may easily be affected by stress, resulting in cracks or peeling. Furthermore, problems such as abnormal electrical connection of the driving circuits are caused.

As described above, existing electronic devices that include display panels still do not meet requirements in all respects. Therefore, researchers in this industry are currently seeking to develop a method of manufacturing an electronic device that can further improve the structural reliability of the electronic device.

SUMMARY

In accordance with some embodiments of the present disclosure, a method of manufacturing an electronic device is provided. The method includes the following steps: providing a substrate; forming a thin-film transistor layer on the substrate; forming a first passivation layer on the substrate; forming an organic layer on the substrate; patterning the organic layer to expose a first region; forming a second passivation layer on the substrate; patterning the first passivation layer to expose a second region; forming a bonding pad on the substrate, wherein the bonding pad corresponds to an overlapping area of the first region and the second region; and bonding an electronic component to the bonding pad.

In accordance with some embodiments of the present disclosure, an electronic device is provided. The electronic device includes a substrate, a thin-film transistor layer, a first passivation layer, an organic layer, a second passivation layer, a bonding pad and an electronic component. The thin-film transistor layer is disposed on the substrate. The first passivation layer is disposed on the thin-film transistor layer. The first passivation layer has a first portion and a second portion. The first portion is an opening or a recess, and the second portion is adjacent to the first portion. The organic layer is disposed on the first passivation layer, and the organic layer has an opening. The second passivation layer is disposed on the organic layer. The bonding pad is disposed on the thin-film transistor layer. The bonding pad corresponds to an overlapping area of the first portion of the first passivation layer and the opening of the organic layer. The electronic component is bonded to the bonding pad.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
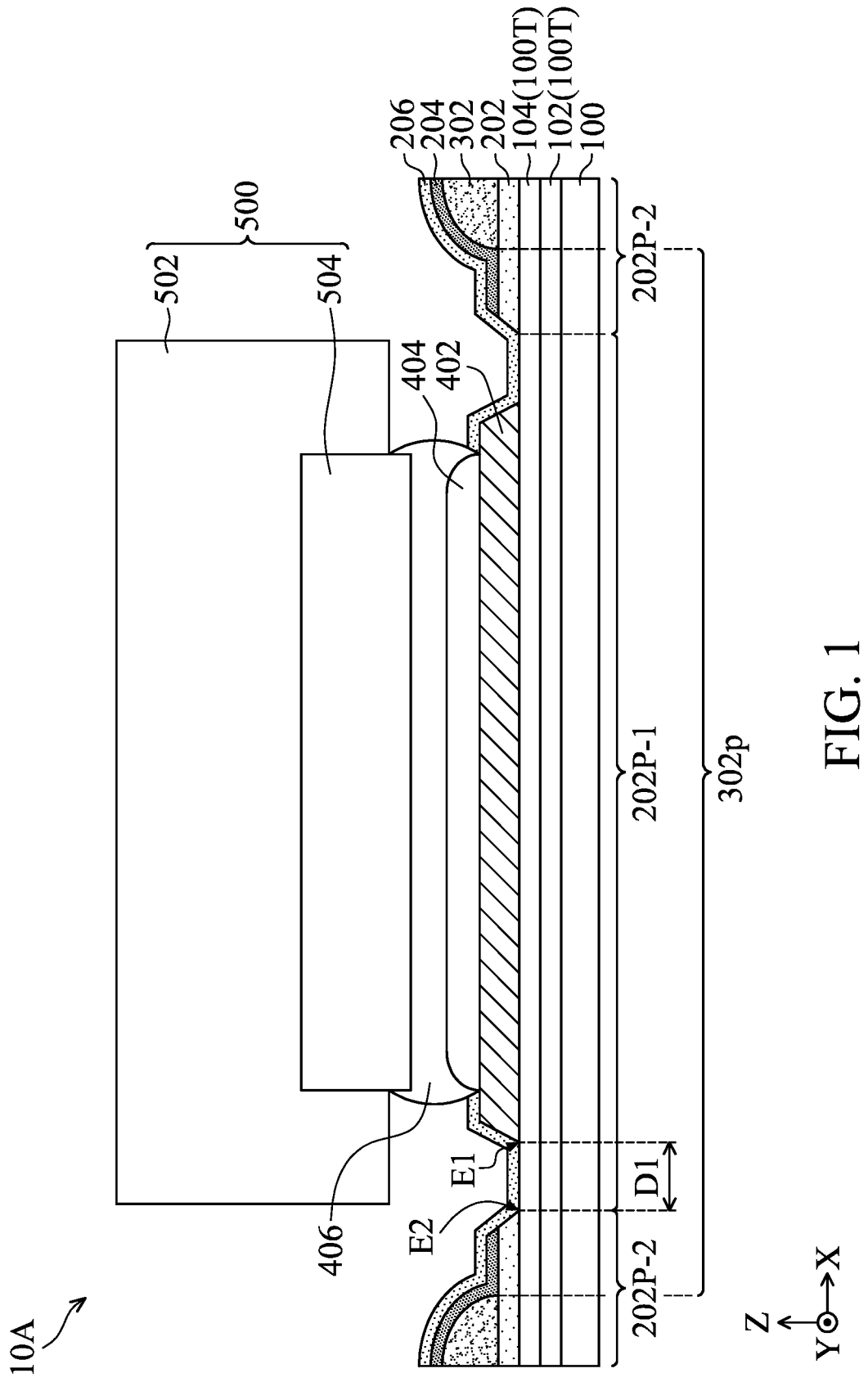
FIG. 1 is a cross-sectional diagram of an electronic device in accordance with some embodiments of the present disclosure.

An electronic device and a method of manufacturing an electronic device according to the present disclosure are described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first material layer is disposed on or over a second material layer" may indicate that the first material layer is in direct contact with the second material layer, or it may indicate that the first material layer is in indirect contact with the second material layer. In the situation where the first material layer is in indirect contact with the second material layer, there may be one or more intermediate layers between the first material layer and the second material layer. However, the expression "the first material layer is directly disposed on or over the second material layer" means that the first material layer is in direct contact with the second material layer, and there is no intermediate element or layer between the first material layer and the second material layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. For example, the first element in the specification may refer to the second element in the claims.

In accordance with the embodiments of the present disclosure, regarding the terms such as "connected to", "interconnected with", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected to" or "electrically coupled to" may include any direct or indirect electrical connection means.

In the following descriptions, terms "about" and "substantially" typically mean +/−10% of the stated value, or typically +/−5% of the stated value, or typically +/−3% of the stated value, or typically +/−2% of the stated value, or typically +/−1% of the stated value or typically +/−0.5% of the stated value. The stated value of the present disclosure is an approximate value. When there is no specific description, the stated value includes the meaning of "about" or "substantially". The expression "in a range from the first value to the second value" or "between the first value and the second value" means that the range includes the first value, the second value, and other values in between.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with the embodiments of the present disclosure, a method of manufacturing an electronic device is provided, which can improve the structural strength of the junction between the bonding pad and the electronic component in the electronic device that is formed, and can reduce the risk of cracks in the substrate or peeling of the electronic component from the substrate. Thereby, the reliability of the electronic device can be improved.

In accordance with the embodiments of the present disclosure, the electronic device may include a display device, a backlight device, a touch device, a sensing device, an antenna device, or a tiled device (a tiled device having any of the above functions or a hybrid function), but it is not limited thereto. The electronic device may include a bendable electronic device or a flexible electronic device, but it is not limited thereto. The antenna device may be a liquid-crystal antenna device or a non-liquid crystal antenna device, and the sensing device may be a sensing device for sensing capacitance, light, heat or ultrasonic waves, but it is not limited thereto. The electronic device may include, for example, liquid crystal, quantum dots (QDs), fluorescence, phosphors, other suitable materials, or a combination thereof. In accordance with some embodiments, the electronic device may include electronic components, and the electronic components may include passive elements and active elements, such as, capacitors, resistors, inductors, diodes, transistors, or combinations thereof, but they are limited thereto. For example, the diodes may include organic light-emitting diodes (OLEDs), micro light-emitting diodes (micro-LEDs, mini-LEDs) or quantum dot light-emitting diodes (QLEDs, QDLEDs), but they are not limited thereto. In accordance with some embodiments, the electronic device may include a panel and/or a backlight module, and the panel may include, for example, a liquid-crystal panel, but it is not limited thereto. It should be understood that the electronic device of the present disclosure will be described below by taking a display device as an example, but the present disclosure is not limited thereto.

Refer to FIG. 1, which is a cross-sectional diagram of an electronic device 10A in accordance with some embodiments of the present disclosure. It should be understood that, some elements of the electronic device 10A are omitted in the figures, and only some elements are schematically shown in the figures for clarity. In accordance with some embodiments, additional features may be added to the electronic device 10A described below. In accordance with some other embodiments, some features of the electronic device 10A described below may be replaced or omitted.

In accordance with some embodiments, the electronic device 10A includes a display panel, which may include a substrate 100, a first passivation layer 202, an organic layer 302, a second passivation layer 204, a bonding pad 402, and an electronic component 500.

The substrate 100 may be used as a driving substrate, and a driving circuit (not illustrated) may be disposed on the substrate 100. The driving circuit may include an active driving circuit and/or a passive driving circuit. In accordance with some embodiments, the driving circuit may include thin-film transistors (TFTs) (for example, switching transistors, driving transistors, reset transistors, or other thin-film transistors), data lines, scan lines, conductive pads, dielectric layers or other circuits, etc., but it is not limited thereto. In accordance with some embodiments, the display panel includes a thin-film transistor layer 100T (for example, referring to FIG. 5), and the thin-film transistor layer 100T is disposed on the substrate 100. As shown in FIG. 1, in accordance with some embodiments, the display panel includes a first insulating layer 102 and a second insulating layer 104, and the first insulating layer 102 and the second insulating layer 104 are parts of the thin-film transistor layer 100T. The structure of the thin-film transistor layer 100T will be described in detail in the following context.

The substrate 100 may include a rigid substrate or a flexible substrate. In accordance with some embodiments, the material of the substrate 100 may include glass, semiconductor materials, quartz, sapphire, polyimide (PI), polycarbonate (PC), polyethylene terephthalate (PET), another suitable material or a combination thereof, but it is not limited thereto. In accordance with some embodiments, the semiconductor material may include, but is not limited to, silicon (Si), germanium (Ge), another suitable semiconductor material, or a combination thereof. In accordance with some embodiments, the substrate 100 may include a flexible printed circuit (FPC).

The first passivation layer 202 may be disposed on the substrate 100 and the thin-film transistor layer 100T. The first passivation layer 202 may have a first portion 202P-1 and a second portion 202P-2. The first portion 202P-1 may be an opening or a recess. The second portion 202P-2 may be adjacent to the first portion 202P-1, and the second portion 202P-2 may surround the first portion 202P-1. In the embodiment shown in FIG. 1, the first portion 202P-1 is an opening. That is, the first passivation layer 202 has an opening or a hollow portion.

Moreover, as shown in FIG. 1, in accordance with some embodiments, the distance D1 between the edge E1 of the bonding pad 402 and the edge E2 of the first passivation layer 202 may be greater than or equal to 5 micrometers and less than or equal to 100 micrometers (i.e. 5 μm≤distance D1≤100 μm), or greater than or equal to 10 μm and less than or equal to 20 μm (i.e. 10 μm≤distance D1≤20 μm).

In accordance with the embodiments of the present disclosure, the distance D1 refers to the minimum distance between the edge E1 of the bonding pad 402 and the edges E2 of the first passivation layer 202 in a direction perpendicular to the normal direction of the substrate 100 (e.g., the X direction in the drawing). The edge E1 of the bonding pad 402 may be the bottom edge of the bonding pad 402, and the edge E2 of the first passivation layer 202 may be the bottom edge of the second portion 202P-2 that is closest to the bonding pad 402.

Furthermore, in accordance with some embodiments, the thickness of the first portion 202P-1 is less than the thickness of the second portion 202P-2. Specifically, in this embodiment, the first portion 202P-1 is an opening, the thickness of the first portion 202P-1 is 0, and the thickness of the second portion 202P-2 of the first passivation layer 202 is greater than or equal to 0.01 micrometers and less than or equal to 5 micrometers (i.e. 0.01 μm≤the thickness of the second portion 202P-2≤5 μm), or greater than or equal to 0.1 micrometers and less than or equal to 0.3 micrometers (i.e. 0.1 μm≤the thickness of the second portion 202P-2≤0.3 μm).

In accordance with the embodiments of the present disclosure, the thickness of the second portion 202P-2 of the first passivation layer 202 refers to the maximum thickness of the second portion 202P-2 of the first passivation layer 202 in the normal direction of the substrate 100 (e.g., the Z direction in the drawing) that can be measured in a cross-sectional image.

In accordance with some embodiments, the material of the first passivation layer 202 may include inorganic materials, but it is not limited thereto. For example, the inorganic material may include, but is not limited to, silicon nitride, silicon oxide, silicon oxynitride, another suitable material, or a combination thereof.

It should be understood that, in accordance with the embodiments of the present disclosure, an optical microscope (OM), a scanning electron microscope (SEM), a film thickness profiler (α-step), an ellipsometer or other suitable methods can be used to measure the thickness, width or height of an element, or the distance or spacing between elements. Specifically, in accordance with some embodiments, a scanning electron microscope can be used to obtain a cross-sectional image including the element to be measured, and the thickness, width or height of the element, or the distance or spacing between elements in the image can be measured.

In addition, the organic layer 302 may be disposed on the first passivation layer 202, and the organic layer 302 may have an opening 302p. In accordance with some embodiments, the area of the opening 302p is larger than the area of the first portion 202P-1 of the first passivation layer 202, and the first portion 202P-1 is located within the opening 302p. In accordance with some embodiments, in the normal direction of the substrate 100 (e.g., the Z direction in the drawing), the first portion 202P-1 of the first passivation layer 202 overlaps the area of the opening 302p of the organic layer 302. As shown in FIG. 1, the first passivation layer 202 may protrude outward the organic layer 302 and extend toward the bonding pad 402.

In accordance with some embodiments, the organic layer 302 may be a photoresist material. For example, the photoresist material may include epoxy resins, acrylic resins (e.g., polymethylmethacrylate (PMMA), benzocyclobutene (BCB), polyimide, perfluoroalkoxy alkane (PFA), another suitable material, or a combination thereof, but it is not limited thereto.

Furthermore, the second passivation layer 204 may be disposed on the organic layer 302 and at least partially cover the first passivation layer 202. Specifically, the second passivation layer 204 may be conformally formed on the surfaces of the organic layer 302 and the first passivation layer 202 and be in contact with the organic layer 302 and the first passivation layer 202. As shown in FIG. 1, in accordance with some embodiments, the second passivation layer 204 also has an opening (not labeled), and in the normal direction of the substrate 100 (e.g., the Z direction in the drawing), the opening of the second passivation layer 204 substantially overlaps the first portion 202P-1 of the first passivation layer 202. Furthermore, the area of the opening 302p of the organic layer 302 is also larger than the area of the opening of the second passivation layer 204.

In accordance with some embodiments, the material of the second passivation layer 204 may be the same as or similar to the material of the first passivation layer 202, and thus is not repeated here.

It should be noted that, since the first passivation layer 202, the organic layer 302 and the second passivation layer 204 are formed in sequence, the organic layer 302 remaining between the first passivation layer 202 and the second passivation layer 204 after the patterning process is likely to cause the interface between the first passivation layer 202 and second passivation layer 204 to peel off. With the structure described in the embodiments of the present disclosure, the interface where the first passivation layer 202 is in contact with the second passivation layer 204 is located outside the area of the bonding pad 402. That is, the interface between the first passivation layer 202 and the second passivation layer 204 does not overlap with the bonding position of the bonding pad 402. Therefore, the risk of cracking on the substrate 100 or peeling of the electronic component 500 from the substrate 100 can be reduced, thereby improving the reliability of the electronic device.

In addition, the electronic device 10A may include a third passivation layer 206, and the third passivation layer 206 may serve as a pixel definition layer (PDL). The third passivation layer 206 may be disposed on the second passivation layer 204 and at least partially cover the bonding pad 402. Specifically, the third passivation layer 206 may conformally cover the second passivation layer 204, the first passivation layer 202, the second insulating layer 104 and the bonding pad 402. As shown in FIG. 1, in this embodiment, in the first portion 202P-1, a portion of the third passivation layer 206 may be in direct contact with the second insulating layer 104.

In accordance with some embodiments, the material of the third passivation layer 206 may be the same as or similar to the material of the first passivation layer 202 or the second passivation layer 204, and thus is not repeated here.

Referring to FIG. 1, the bonding pad 402 may be disposed on the substrate 100 and the thin-film transistor layer 100T, and the bonding pad 402 may be disposed corresponding to an overlapping area of the first portion 202P-1 of the first passivation layer 202 and the opening 302p of the organic layer 302. In other words, the bonding pad 402 may be disposed within the overlapping area of the first portion 202P-1 of the first passivation layer 202 and the opening 302p of the organic layer 302. As shown in FIG. 1, in accordance with some embodiments, the bonding pad 402 may be in direct contact with the thin-film transistor layer 100T.

Moreover, the electronic component 500 may be bonded to the bonding pad 402. Specifically, in the normal direction of the substrate 100 (e.g., the Z direction in the drawing), the bonding pad 402 may overlap with the electronic components 500. The bonding pad 402 may be electrically connected to the driving circuit (e.g., the thin-film transistor layer 100T) on the substrate 100. The bonding pad 402 may be electrically connected to the electronic component 500 through a solder pad 404 and a solder material 406 to transmit the signal of the driving circuit to the electronic component 500.

In accordance with some embodiments, the material of the bonding pad 402 may include a conductive material, such as a metal material, but it is not limited thereto. For example, the metal material may include copper (Cu), aluminum (Al), indium (In), ruthenium (Ru), tin (Sn), gold (Au), platinum (Pt), zinc (Zn), silver (Ag), titanium (Ti), lead (Pb), nickel (Ni), chromium (Cr), magnesium (Mg), palladium (Pd), copper alloys, aluminum alloys, indium alloys, ruthenium alloys, tin alloys, gold alloys, platinum alloys, zinc alloys, silver alloys, titanium alloys, lead alloys, nickel alloys, chromium alloys, magnesium alloys, palladium alloys, another suitable conductive material or a combination thereof, but it is not limited thereto.

In accordance with some embodiments, the electronic component 500 may include a light-emitting element, a chip on film (COF) structure, or another component to be bonded to a substrate. In accordance with some embodiments, the electronic component 500 (for example, a light-emitting element) may include a lead frame 502 and a conductive structure 504, a light-emitting unit (not illustrated) of the light-emitting element may be disposed in the lead frame 502, and the lead frame 502 may be electrically connected to the conductive structure 504. Moreover, the conductive structure 504 may be electrically connected to the bonding pad 402 through the solder pad 404 and the solder material 406. The solder pad 404 and the solder material 406 may be disposed between the electronic component 500 and the bonding pad 402, and the solder material 406 may be used to bond the electronic component 500 to the bonding pad 402. Specifically, the solder material 406 may be used to bond the conductive structure 504 to the solder pad 404.

In accordance with some embodiments, the light-emitting unit may include a light-emitting diode or a light-emitting package. The light-emitting diode may include, for example, an organic light-emitting diode, an inorganic light-emitting diode, a mini light-emitting diode, a micro light-emitting diode, or a quantum dot light-emitting diode (for example, a QLED or a QDLED), another suitable light-emitting unit, or a combination thereof, but it is not limited thereto.

Specifically, in accordance with some embodiments, the light-emitting unit may include, for example, a first semiconductor layer (not illustrated), a second semiconductor layer (not illustrated), and a quantum well layer (not illustrated) disposed between the first semiconductor layer and the second semiconductor layer, but the present disclosure is not limited thereto. Furthermore, the first semiconductor layer and the second semiconductor layer may be formed of III-V compounds with dopants of p-conductivity type and n-conductivity type (e.g., gallium nitride having p-conductivity type and n-conductivity type). In addition, the quantum well layer may include a single quantum well (SQW) or multiple quantum well (MQW). In accordance with some embodiments, the III-V compound may include gallium nitride (GaN), indium nitride (InN), aluminum nitride (AlN), indium gallium nitride (InGaN), aluminum gallium nitride (AlGaN), aluminum gallium indium nitride (AlGaInN), another suitable material, or a combination thereof, but it is not limited thereto. In accordance with some embodiments, the quantum well layer may include indium gallium nitride, gallium nitride, another suitable material, or a combination thereof, but it is not limited thereto.

In accordance with some embodiments, the conductive structure 504 may be, for example, an anode electrode and/or a cathode electrode of the light-emitting unit. In accordance with some embodiments, the conductive structure 504 may include a metal material, such as copper, aluminum, indium, ruthenium, tin, gold, platinum, zinc, silver, titanium, lead, nickel, chromium, magnesium, palladium, copper alloys, aluminum alloys, indium alloys, ruthenium alloys, tin alloys, gold alloys, platinum alloys, zinc alloys, silver alloys, titanium alloys, lead alloys, nickel alloys, chromium alloys, magnesium alloys, palladium alloys, another suitable metal material, or a combination thereof, but it is not limited thereto.

In accordance with some embodiments, the material of the solder pad 404 may include, nickel (Ni), copper (Cu), nickel alloys, copper alloys, another suitable material, or a combination thereof, but it is not limited thereto. In accordance with some embodiments, the solder material 406 may include tin (Sn), aluminum (Al), tin alloys, aluminum alloys, another suitable solder material, or a combination thereof, but it is not limited thereto. In accordance with some other embodiments, the solder material 406 may include an anisotropic conductive film (ACF), but it is not limited thereto.

Figure 2:
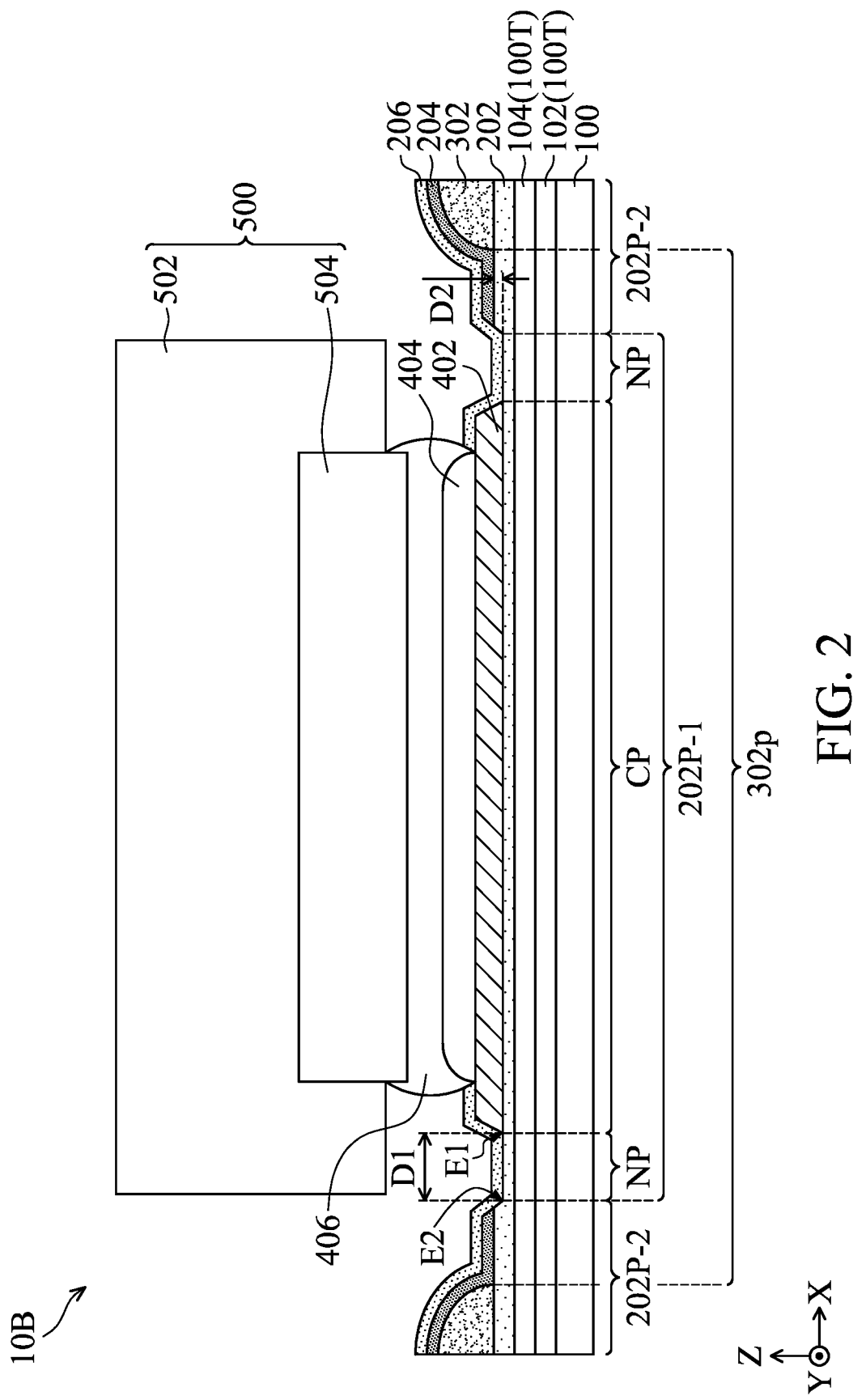
FIG. 2 is a cross-sectional diagram of an electronic device in accordance with some embodiments of the present disclosure.

Next, refer to FIG. 2, which is a cross-sectional diagram of an electronic device 10B in accordance with some other embodiments of the present disclosure. It should be understood that that the same or similar components or elements in the following paragraphs will be denoted by the same or similar reference numbers, and their materials and functions are the same or similar to those described above, and thus they will not be repeated hereafter.

The electronic device 10B shown in FIG. 2 is substantially similar to the aforementioned electronic device 10A. The differences between them include that, in the electronic device 10B, the first portion 202P-1 of the first passivation layer 202 is a recess, a part of the first portion 202P-1 is disposed between the second insulating layer 104 and the bonding pad 402, and a part of the first portion 202P-1 is disposed between the second insulating layer 104 and the third passivation layer 206. In this embodiment, the bonding pad 402 is in direct contact with the first passivation layer 202. Specifically, the bottom surface of the bonding pad 402 is in direct contact with the first passivation layer 202.

In addition, in this embodiment, the first portion 202P-1 includes a contact region CP and a non-contact region NP, the contact region CP is in contact with the bonding pad 402, the non-contact region NP is connected to the contact region CP, and the non-contact region NP surrounds the contact region CP. In this embodiment, the contact region CP is disposed between the second insulating layer 104 and the bonding pad 402, and the non-contact region NP is disposed between the second insulating layer 104 and the third passivation layer 206. As described above, the distance D1 between the edge E1 of the bonding pad 402 and the edge E2 of the first passivation layer 202 may be greater than or equal to 5 μm and less than or equal to 100 μm (i.e. 5 μm≤distance D1≤100 μm), or greater than or equal to 10 μm and less than or equal to 20 μm (i.e. 10 μm≤distance D1≤20 μm). In this embodiment, the edge E2 of the first passivation layer 202 can also be regarded as the outer edge of the non-contact region NP. Therefore, the distance D1 between the edge E1 of the bonding pad 402 and the outer edge of the non-contact region NP may be greater than or equal to 5 μm and less than or equal to 100 μm (i.e. 5 μm≤distance D1≤100 μm), or greater than or equal to 10 μm and less than or equal to 20 μm (i.e. 10 μm≤distance D1≤20 μm).

Furthermore, the thickness of the first portion 202P-1 may be smaller than the thickness of the second portion 202P-2. In this embodiment, the thickness difference D2 between the thickness of the first portion 202P-1 and the thickness of the second portion 202P-2 may be greater than or equal to 0.01 μm and less than or equal to 5 μm (i.e. 0.01 μm≤thickness difference D2≤5 μm). Specifically, in this embodiment, the first portion 202P-1 is a recess, and the thickness of the first portion 202P-1 may be greater than or equal to 0.01 μm and less than or equal to 4.99 μm (i.e. 0.01 μm≤the thickness of the first portion 202P-1≤4.99 μm), while the thickness of the second portion 202P-2 of the first passivation layer 202 may be greater than or equal to 0.01 μm and less than or equal to 10 μm (i.e. 0.01 μm≤the thickness of the second portion 202P-2≤10 μm).

In accordance with the embodiments of the present disclosure, the thickness of the first portion 202P-1 of the first passivation layer 202 refers to the maximum thickness of the first portion 202P-1 of the first passivation layer 202 in the normal direction of the substrate 100 (e.g., the Z direction in the drawing) that can be measured in a cross-sectional image.

Figure 3:
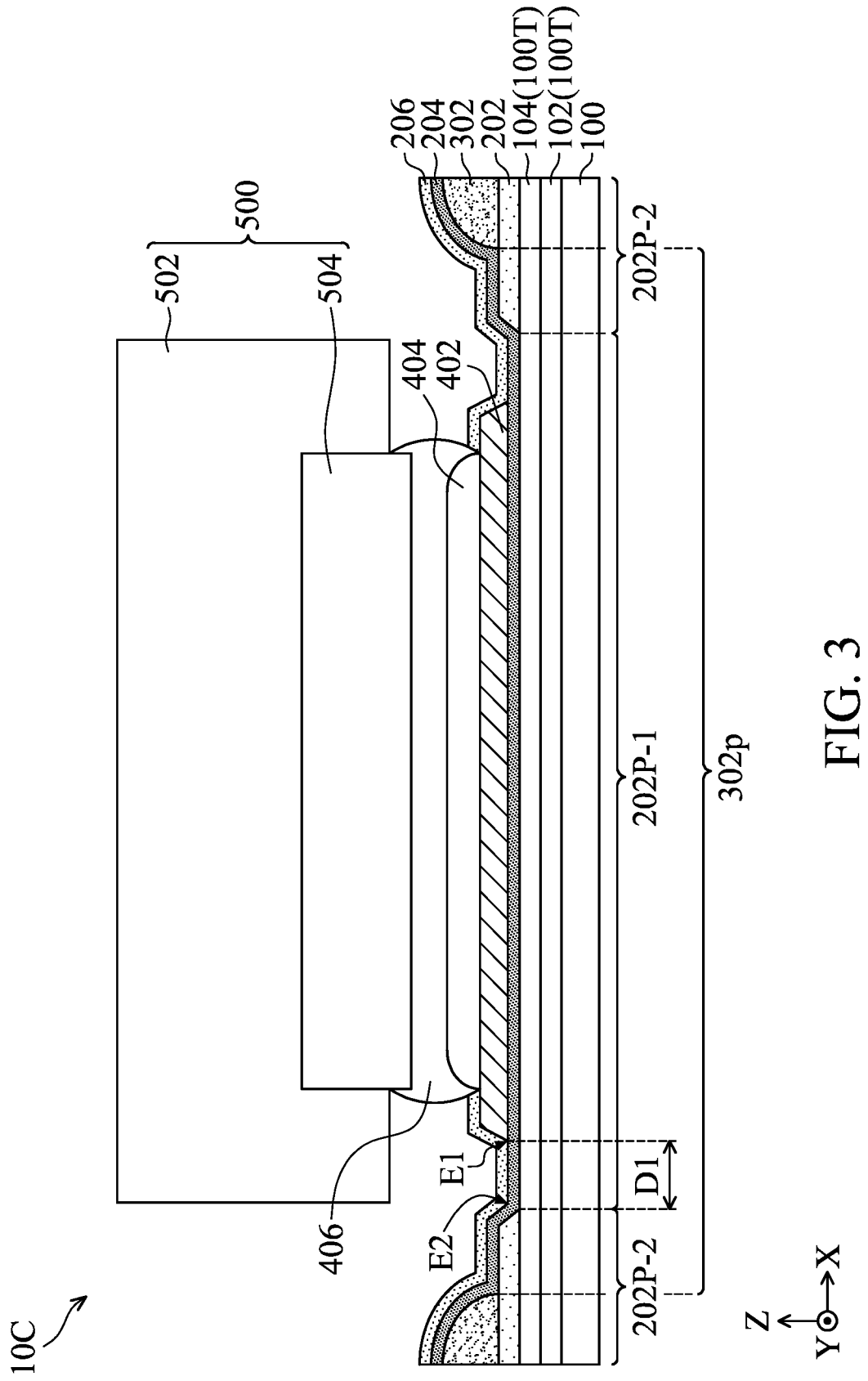
FIG. 3 is a cross-sectional diagram of an electronic device in accordance with some embodiments of the present disclosure.

Next, refer to FIG. 3, which is a cross-sectional diagram of an electronic device 10C in accordance with some other embodiments of the present disclosure. The electronic device 10C shown in FIG. 3 is substantially similar to the aforementioned electronic device 10A. The differences between them include that, in the electronic device 10C, in addition to being disposed on the organic layer 302 and the first passivation layer 202, the second passivation layer 204 further extends on the second insulating layer 104. Specifically, a part of the second passivation layer 204 is disposed between the second insulating layer 104 and the third passivation layer 206, and a part of the second passivation layer 204 is disposed between the second insulating layer 104 and the bonding pad 402. In this embodiment, the first portion 202P-1 of the first passivation layer 202 is an opening, and the bonding pad 402 is in direct contact with the second passivation layer 204.

Figure 4:
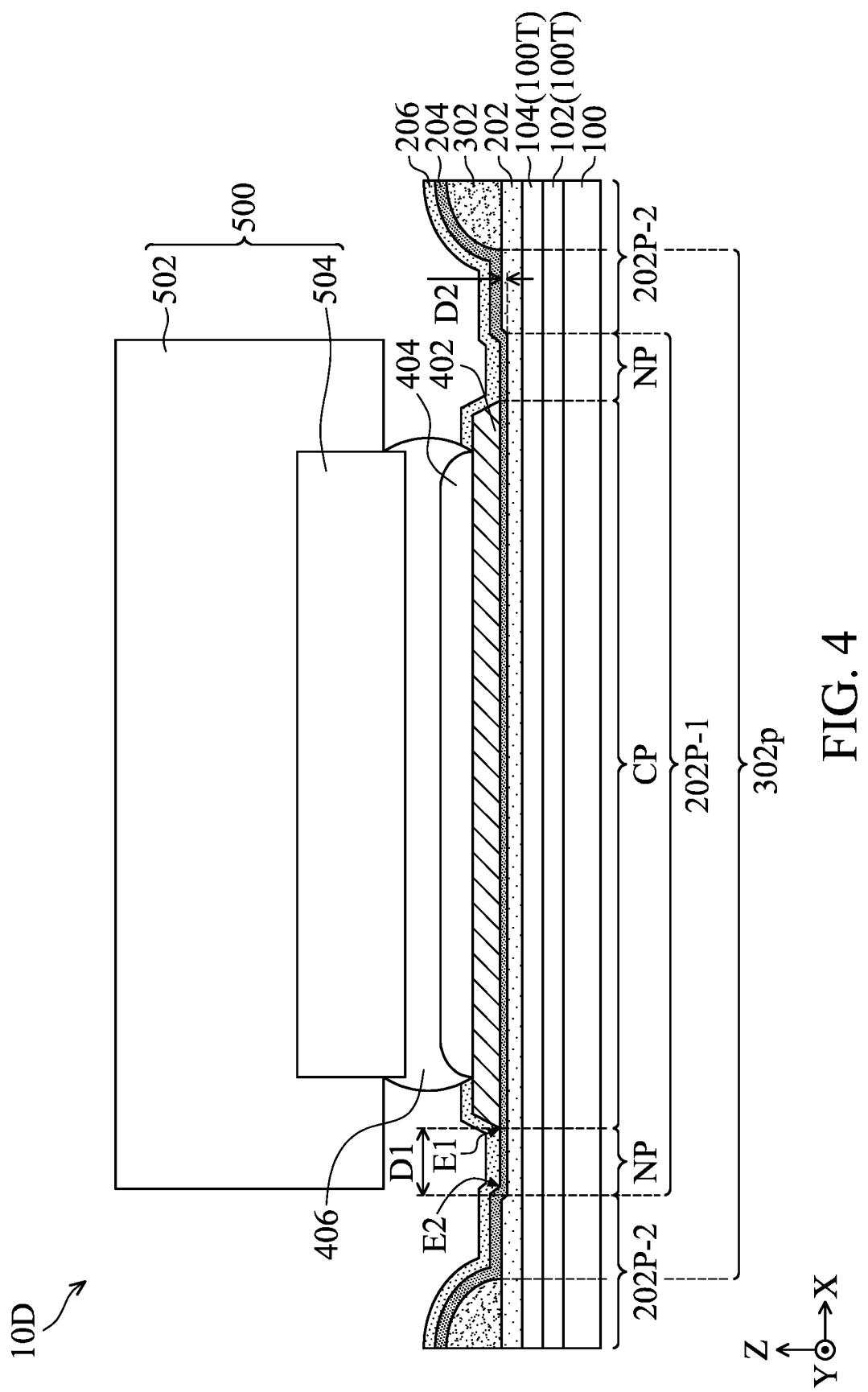
FIG. 4 is a cross-sectional diagram of an electronic device in accordance with some embodiments of the present disclosure.

Next, please refer to FIG. 4, is a cross-sectional diagram of an electronic device 10D in accordance with some other embodiments of the present disclosure. The electronic device 10D shown in FIG. 4 is substantially similar to the aforementioned electronic device 10B. The differences between them include that in the electronic device 10D, in addition to being disposed on the organic layer 302 and the second portion 202P-2 of the first passivation layer 202, the second passivation layer 204 further extends on the first portion 202P-1 of the second insulating layer 104. Specifically, a part of the second passivation layer 204 is disposed between the first passivation layer 202 and the third passivation layer 206, and a part of the second passivation layer 204 is disposed between the first passivation layer 202 and the bonding pad 402. In this embodiment, the first portion 202P-1 of the first passivation layer 202 is a recess, and the bonding pad 402 is in direct contact with the second passivation layer 204.

Next, refer to FIG. 5, FIG. 6, FIG. 7, FIG. 8, FIG. 9A, FIG. 9B, FIG. 10A, FIG. 10B, FIG. 11A and FIG. 11B, which are cross-sectional diagrams of an electronic device during different process stages in accordance with some embodiments of the present disclosure. The figures also show the cross-sectional diagrams of the electronic device in a circuit area A1 and a bonding area A2, and the bonding area A2 substantially corresponds to the area shown in the above FIG. 1 to FIG. 4. It should be understood that, in accordance with some embodiments, additional steps may be added before, during, and/or after the method of manufacturing an electronic device is performed. In accordance with some embodiments, some of the steps described below may be replaced or omitted. In accordance with some embodiments, the order of some of the steps described below may be interchangeable.

Figure 5:
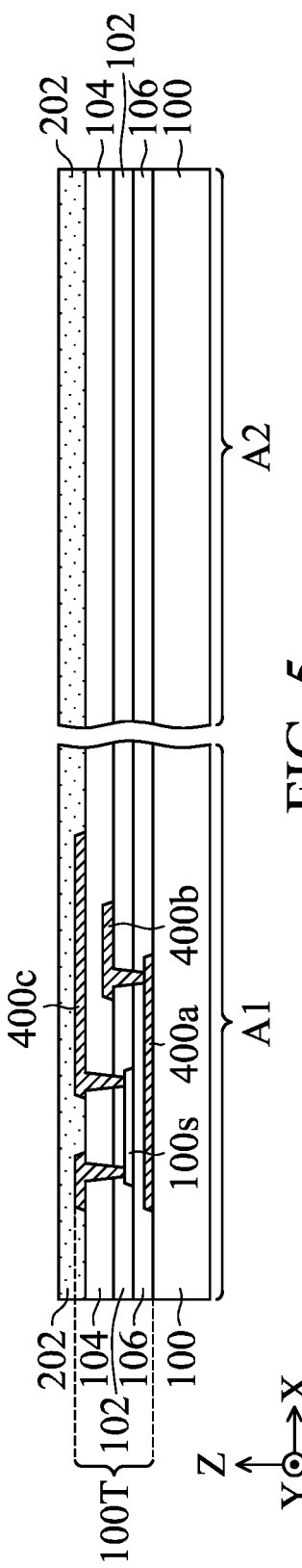
FIG. 5, FIG. 6, FIG. 7, FIG. 8, FIG. 9A, FIG. 9B, FIG. 10A, FIG. 10B, FIG. 11A and FIG. 11B are cross-sectional diagrams of an electronic device during different process stages in accordance with some embodiments of the present disclosure.

In accordance with some embodiments, the method of manufacturing an electronic device may include providing a display panel. Referring to FIG. 5, first, a substrate 100 may be provided, and a thin-film transistor layer 100T may be formed on the substrate 100. In accordance with some embodiments, the thin-film transistor layer 100T may include a buffer layer 106, a first insulating layer 102, a second insulating layer 104, a conductive layer 400a, a conductive layer 400b, a conductive layer 400c, and a semiconductor layer 100s. Specifically, the conductive layer 400a may be formed on the substrate 100 first, and then the buffer layer 106, the semiconductor layer 100s and the first insulating layer 102 may be sequentially formed on the substrate 100. Next, portions of the buffer layer 106 and the first insulating layer 102 may be removed by a patterning process to form a through-hole, and then the conductive layer 400b may be formed in the through-hole and on the first insulating layer 102, and the second insulating layer 104 may be formed on the first insulating layer 102 and the conductive layer 400b. Next, portions of the first insulating layer 102 and the second insulating layer 104 may be removed by a patterning process to form a through-hole, and then the conductive layer 400c may be formed in the through-hole and on the second insulating layer 104.

The first insulating layer 102, the second insulating layer 104, the conductive layer 400a, the conductive layer 400b, the conductive layer 400c, and the semiconductor layer 100s and the like can be used as the driving circuit for the electronic device, and the driving circuit may include thin-film transistors (for example, switching transistors, driving transistors, reset transistors, or other thin-film transistors), data lines, scan lines, conductive pads, dielectric layers or other circuits, etc., but it is not limited thereto. It should be understood that the aspect of the driving circuit and the number of thin-film transistors are not limited to those shown in the figures. According to different embodiments, the thin-film transistor layer 100T may have another suitable aspect of driving circuit or another suitable number or type of thin-film transistor.

In addition, the thin-film transistor may be a top gate thin-film transistor, a bottom gate thin-film transistor, a dual gate (or double gate) thin-film transistor, or a combination thereof. The thin-film transistor may include at least one semiconductor layer 100s, and the semiconductor layer 100s may include amorphous silicon, low-temp polysilicon (LTPS), metal oxide, another suitable material, or a combination thereof, but it is not limited thereto. The metal oxide may include indium gallium zinc oxide (IGZO), indium zinc oxide (IZO), indium gallium zinc tin oxide (IGZTO), another suitable material, or a combination thereof, but it is not limited thereto. In accordance with some embodiments, different thin-film transistors may have the different semiconductor materials as described above.

In accordance with some embodiments, the buffer layer 106, the first insulating layer 102, the second insulating layer 104, and the semiconductor layer 100s may be formed by a coating process, a chemical vapor deposition process, a physical vapor deposition process, a coating process, an evaporation process, a sputtering process, another suitable process, or a combination thereof. The chemical vapor deposition process may include, for example, low pressure chemical vapor deposition (LPCVD), low temperature chemical vapor deposition (LTCVD), rapid thermal chemical vapor deposition (RTCVD), and plasma enhanced chemical vapor deposition (PECVD) or atomic layer deposition (ALD), etc., but it is not limited thereto. For example, the physical vapor deposition process may include a sputtering process, an evaporation process, a pulsed laser deposition, etc., but it is not limited thereto.

In accordance with some embodiments, the conductive layer 400a, the conductive layer 400b, and the conductive layer 400c may be formed by a chemical vapor deposition process, a physical vapor deposition process, an electroplating process, an electroless plating process, another suitable process, or a combination thereof.

Furthermore, the through-hole may be formed by one or more photolithography and/or etching processes. In accordance with some embodiments, the photolithography process may include photoresist coating (e.g., spin coating), soft baking, hard baking, mask alignment, exposure, post-exposure baking, photoresist development, washing and drying, etc., but it is not limited thereto. The etching process may include a dry etching process or a wet etching process, but it is not limited thereto.

Still refer to FIG. 5. Next, a first passivation layer 202 may be formed on the substrate 100 and the aforementioned thin-film transistor layer 100T, and the first passivation layer 202 may cover the second insulating layer 104 and the conductive layer 400c.

In accordance with some embodiments, the first passivation layer 202 may be formed by a coating process, a chemical vapor deposition process, a physical vapor deposition process, a printing process, an evaporation process, a sputtering process, another suitable process, or a combination thereof.

Figure 6:
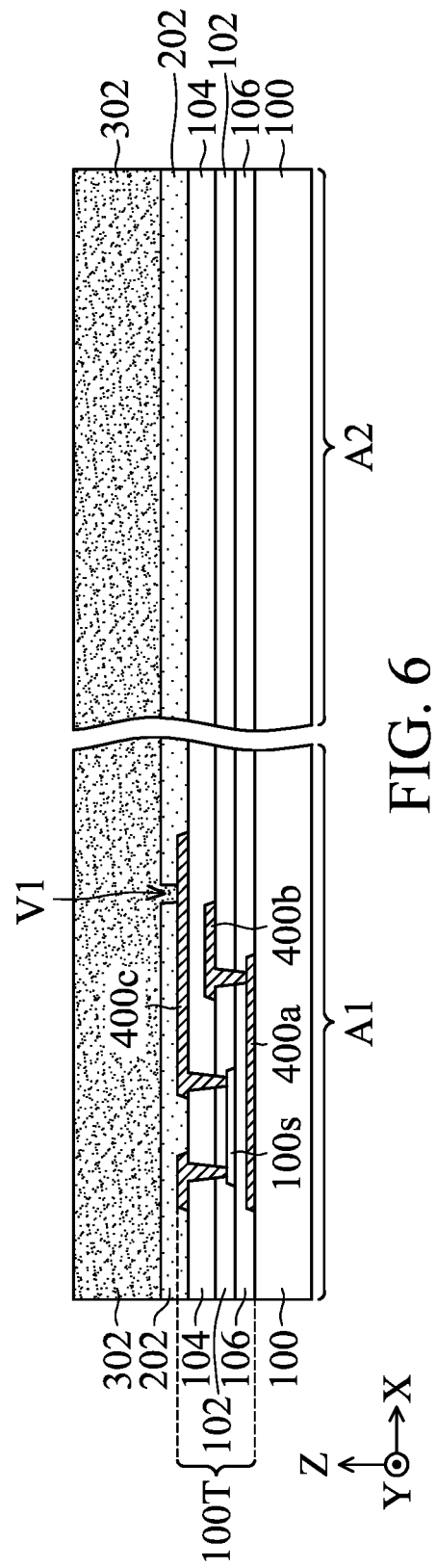

Next, referring to FIG. 6, an organic layer 302 may be formed on the substrate 100 and the first passivation layer 202. In accordance with some embodiments, before the organic layer 302 is formed, a portion of the first passivation layer 202 may be removed by one or more photolithography processes and/or etching processes to form a through-hole V1. The through-hole V1 may expose a portion of the conductive layer 400c.

Figure 7:
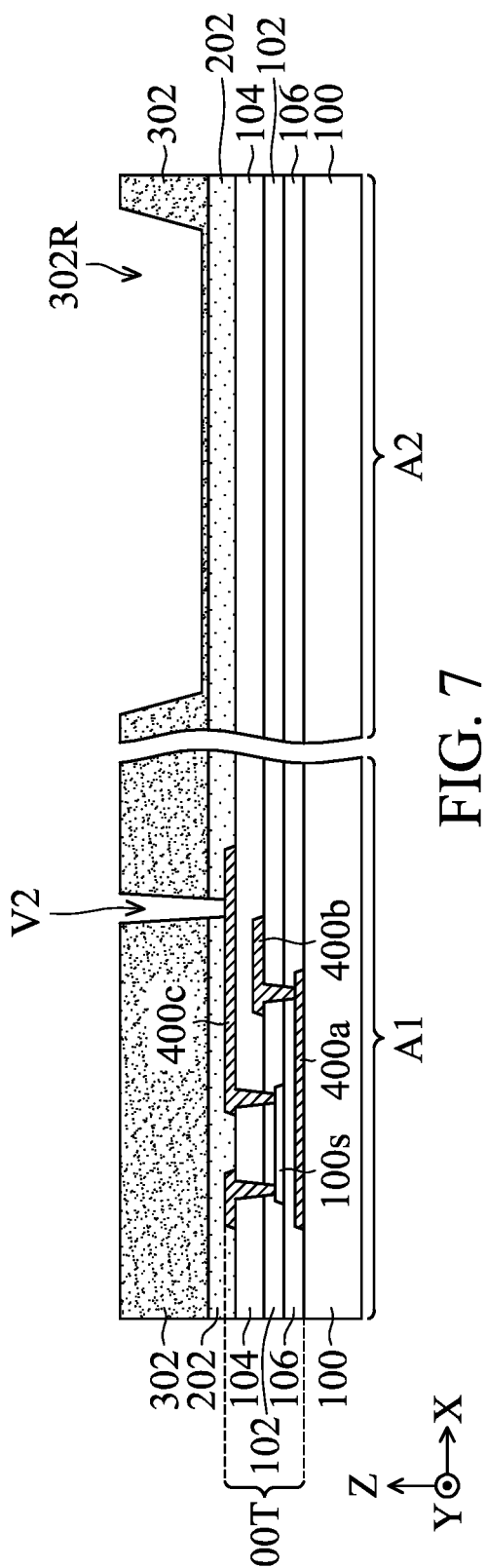

Next, referring to FIG. 7, the organic layer 302 may be patterned to expose a region 302R, and the region 302R may be a recess of the organic layer 302. Specifically, the organic layer 302 may be patterned by one or more photolithography processes and/or etching processes, and a portion of the organic layer 302 may be removed to form a recess in the organic layer 302. As shown in FIG. 7, the patterned organic layer 302 still may be disposed on the top surface of the first passivation layer 202. However, in accordance with some other embodiments, the region 302R may be the top surface of the first passivation layer 202. That is, a portion of the organic layer 302 may be removed by a patterning process to expose the top surface of the first passivation layer 202.

In accordance with some embodiments, during the step of patterning the organic layer 302 in the bonding area A2 to expose the region 302R is performed, a portion of the organic layer 302 may also be removed by one or more photolithography processes and/or etching processes to form a through-hole V2 in the circuit area A1, and the through-hole V2 may expose a portion of the conductive layer 400c again.

Figure 8:
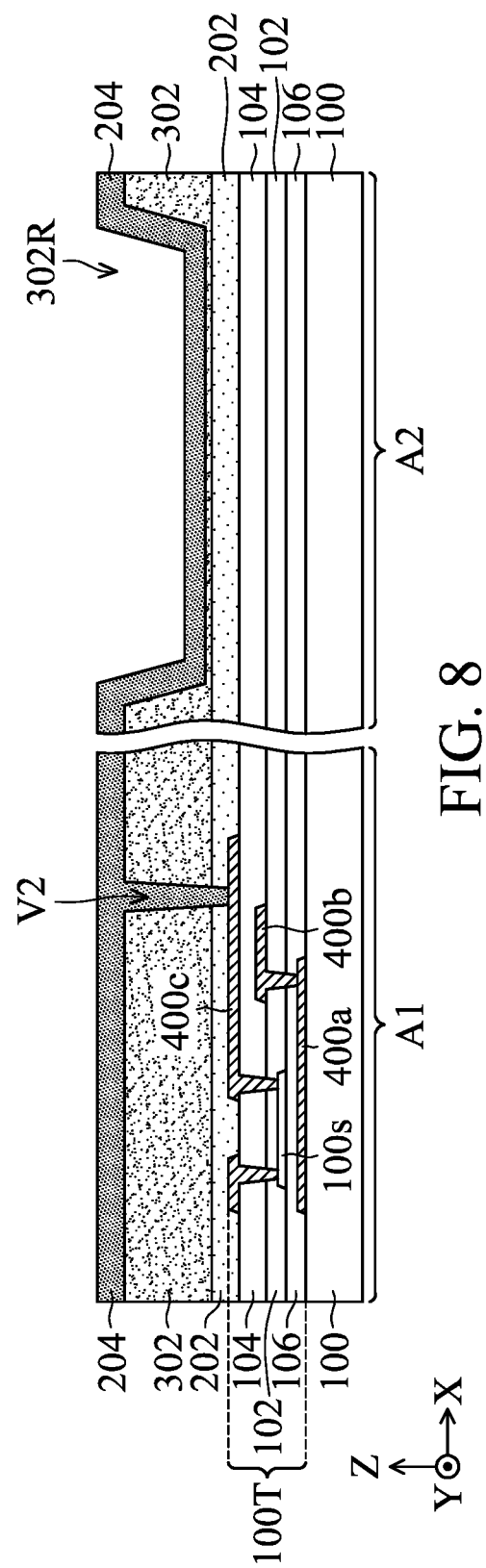

Next, referring to FIG. 8, a second passivation layer 204 may be formed on the substrate 100 and the organic layer 302, and the second passivation layer 204 may be conformally formed on the organic layer 302 and cover the region 302R. Moreover, in the circuit area A1, the second passivation layer 204 may also be filled in the through-hole V2.

In accordance with some embodiments, the method for forming the second passivation layer 204 may be the same as or similar to the process for forming the first passivation layer 202, and thus will not be repeated here.

Figure 9A:
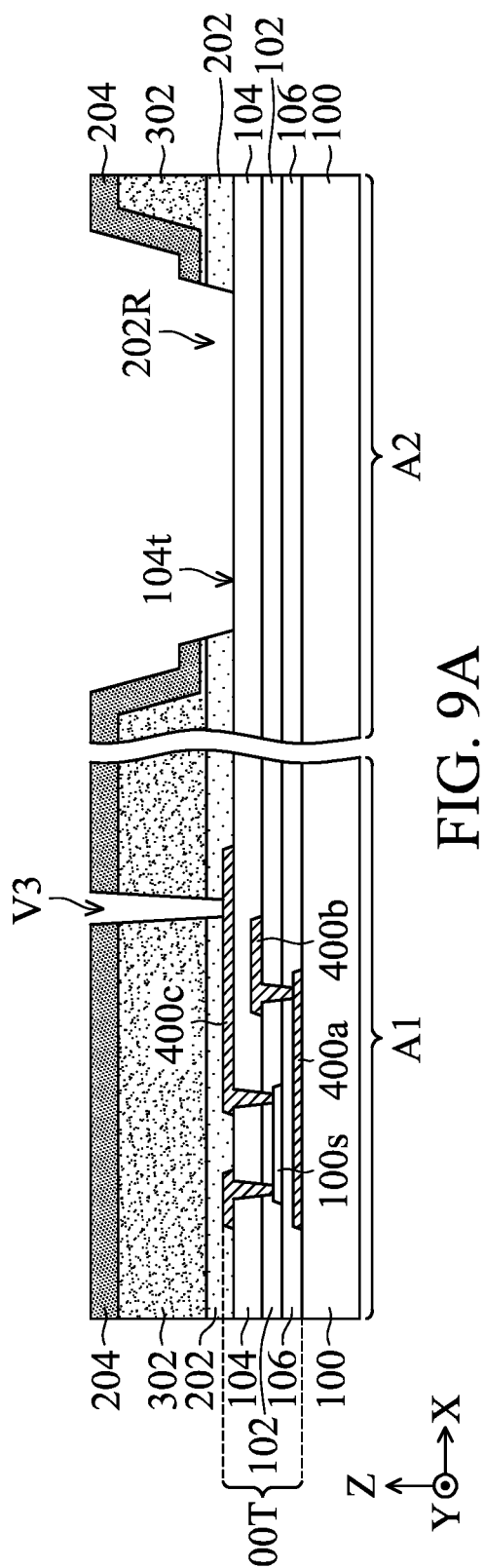

Next, referring to FIG. 9A, in accordance with some embodiments, after the second passivation layer 204 is formed on the substrate 100, the second passivation layer 204 and the first passivation layer 202 may be patterned to expose the region 202R, and the region 202R may be the top surface 104t of the second insulating layer 104 of the thin-film transistor layer 100T. Specifically, the second passivation layer 204 and the first passivation layer 202 may be patterned by one or more photolithography processes and/or etching processes, and portions of the second passivation layer 204 and the first passivation layer 202 (and the organic layer 302) may be removed to the top surface 104t of the second insulating layer 104.

In accordance with some embodiments, during the step of patterning the second passivation layer 204 and the first passivation layer 202 in the bonding area A2 to expose the region 202R is performed, a portion of the second passivation layer 204 may also be removed by one or more photolithography processes and/or etching processes to form a through-hole V3 in the circuit area A1, and the through-hole V3 may expose a portion of the conductive layer 400c again.

Figure 9B:
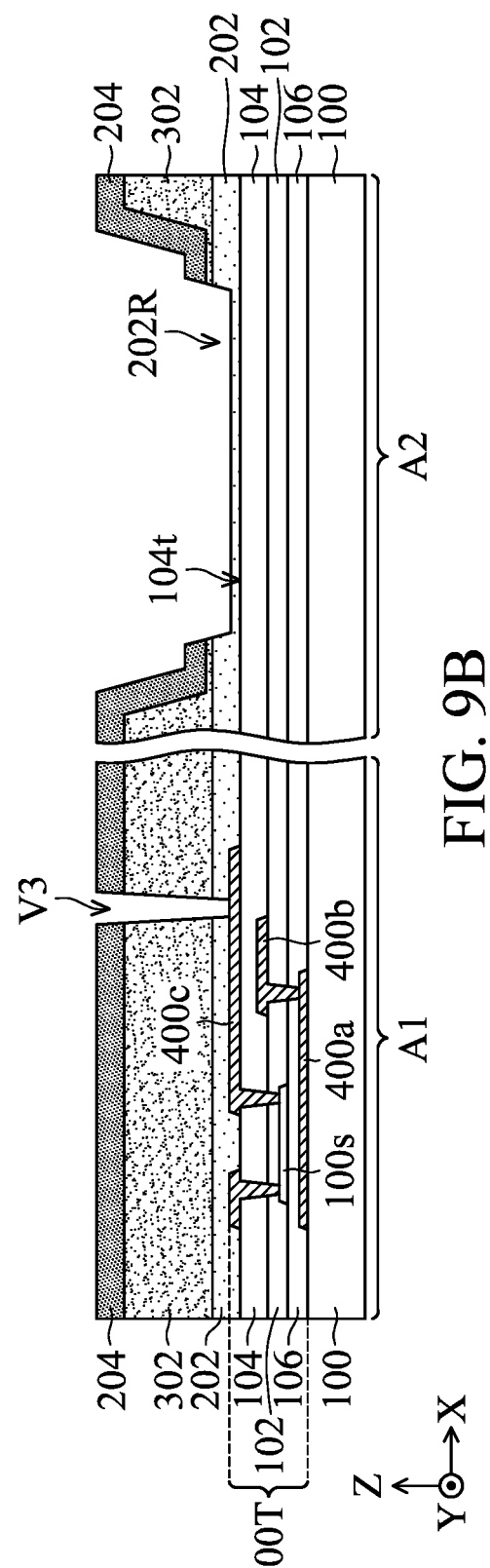

However, in accordance with some other embodiments, referring to FIG. 9B, after the second passivation layer 204 is formed on the substrate 100, the second passivation layer 204 and the first passivation layer 202 may be patterned to expose the region 202R, and the region 202R may be a recess of the first passivation layer 202. Specifically, the second passivation layer 204 and the first passivation layer 202 may be patterned by one or more photolithography processes and/or etching processes, and portions of the second passivation layer 204 and the first passivation layer 202 (and the organic layer 302) may be removed, and a recess may be formed in the first passivation layer 202. As shown in FIG. 9B, in this embodiment, the patterned first passivation layer 202 is still disposed on the top surface 104t of the second insulating layer 104, and the patterning process does not expose the top surface 104t of the second insulating layer 104. Moreover, in accordance with some embodiments, the step of patterning the first passivation layer 202 and the step of patterning the second passivation layer 204 may be performed simultaneously.

Similarly, in this embodiment, during the step of patterning the second passivation layer 204 and the first passivation layer 202 in the bonding area A2 to expose the region 202R is performed, a portion of the second passivation layer 204 may also be removed by one or more photolithography processes and/or etching processes to form a through-hole V3 in the circuit area A1, and the through-hole V3 may expose a portion of the conductive layer 400c again.

Figure 10A:
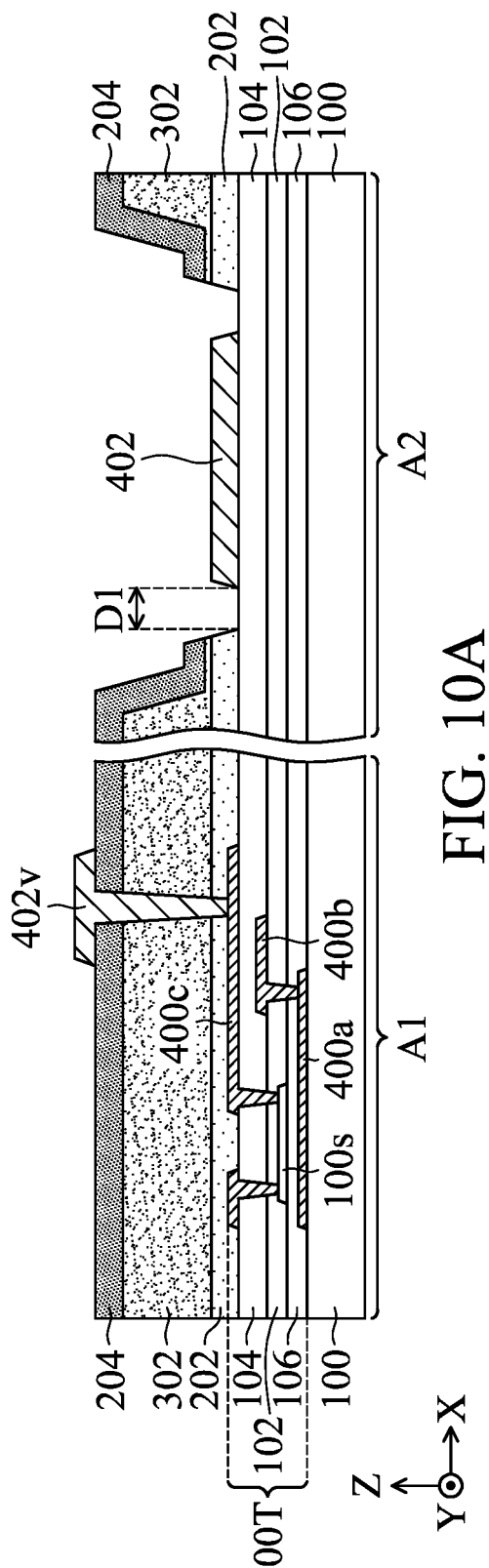
Figure 10B:
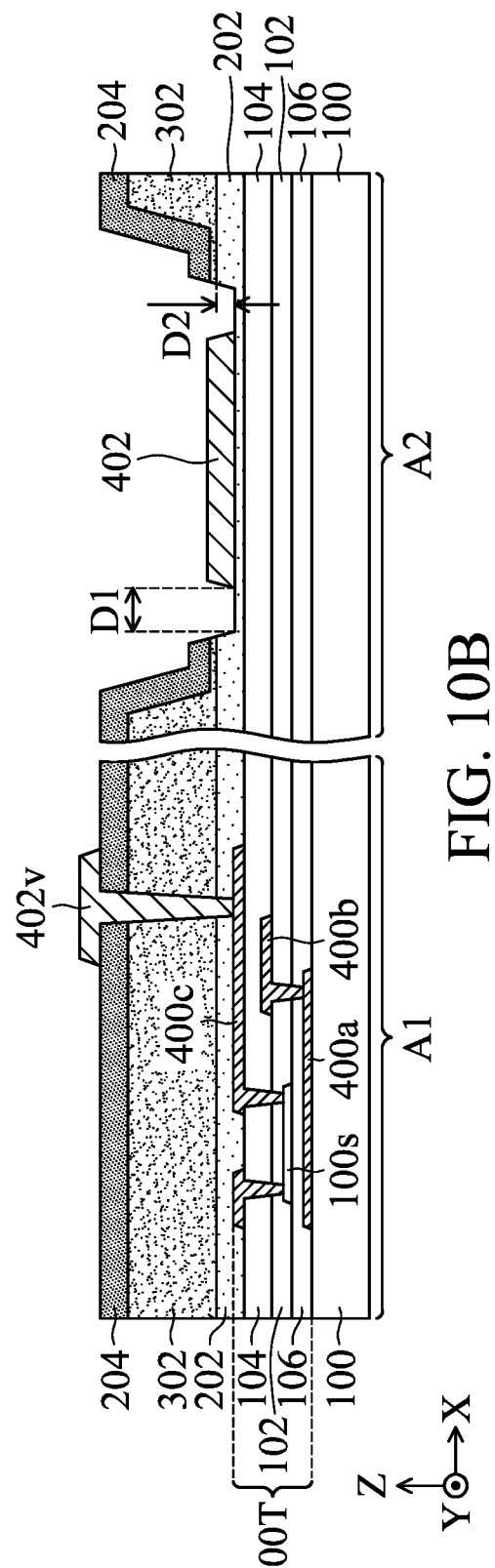

It should be noted that the steps shown in FIG. 9A and FIG. 9B can reduce the probability that the organic layer 302 (e.g., photoresist material) remains in the position where the bonding pad 402 will be formed later, and therefore the bonding pad 402 can be directly formed on the second insulating layer 104 (as shown in FIG. 10A or FIG. 1) or directly on the first passivation layer 202 (as shown in FIG. 10B or FIG. 2). Accordingly, the risk of cracks in the substrate 100 corresponding to the bonding pad 402 or the risk of the electronic component 500 being peeled off from the substrate 100 can be reduced, thereby improving the process yield of the electronic device.

Next, refer to FIG. 10A and FIG. 10B. FIG. 10A and FIG. 10B respectively follow the steps shown in FIG. 9A and FIG. 9B. As shown in FIG. 10A and FIG. 10B, the bonding pad 402 may be formed on the substrate 100. Specifically, as shown in FIG. 10A, in accordance with some embodiments, the bonding pad 402 may be formed on the second insulating layer 104, and the bonding pad 402 may be in direct contact with the second insulating layer 104. As shown in FIG. 10B, in accordance with some embodiments, the bonding pad 402 may be formed on the recess of the first passivation layer 202, and the bonding pad 402 may be in direct contact with the first passivation layer 202.

Specifically, for FIG. 10A, a conductive material may be formed to cover the second passivation layer 204, the first passivation layer 202 and the second insulating layer 104, and then the conductive material may be patterned by one or more photolithography processes and/or etching processes to form the bonding pad 402. For FIG. 10B, a conductive material may be formed to cover the second passivation layer 204 and the first passivation layer 202, and then the conductive material may be patterned by one or more photolithography processes and/or etching processes to form the bonding pad 402.

It should be noted that the formed bonding pad 402 is disposed corresponding to the aforementioned overlapping area of the region 302R and the region 202R. In other words, in the normal direction of the substrate 100 (e.g., the Z direction in the drawing), the bonding pad 402 is disposed within the overlapping area of the region 302R and the region 202R, and the area of the bonding pad 402 is smaller than that of the region 202R. In addition, as described in FIG. 1 and FIG. 2, the distance D1 between the edge E1 (not labeled) of the bonding pad 402 and the edge E2 (not labeled) of the first passivation layer 202 may be greater than or equal to 5 μm and less than or equal to 100 μm (i.e. 5 μm≤distance D1≤100 μm).

Furthermore, as shown in FIG. 10B, the thickness difference D2 between the thickness of the first portion 202P-1 (not labeled) and the thickness of the second portion 202P-2 (not labeled) of the first passivation layer 202 may be greater than or equal to 0.01 μm and less than or equal to 5 μm (i.e. 0.01 μm≤thickness difference D2≤5 μm). That is, the depth to which the first passivation layer 202 is etched away may be greater than or equal to 0.01 micrometers and less than or equal to 5 micrometers.

In addition, during the step of forming the bonding pad 402 in the bonding area A2 is performed, a via 402v may also be formed in the circuit area A1, and the via 402v may be electrically connected to the conductive layer 400c of the thin-film transistor layer 100T.

In accordance with some embodiments, the bonding pad 402 and the via 402v may be formed by a chemical vapor deposition process, a physical vapor deposition process, an electroplating process, an electroless plating process, another suitable process, or a combination thereof. Moreover, one or more photolithography processes and/or etching processes may be performed to form the bonding pad 402 and the via 402v.

Figure 11A:
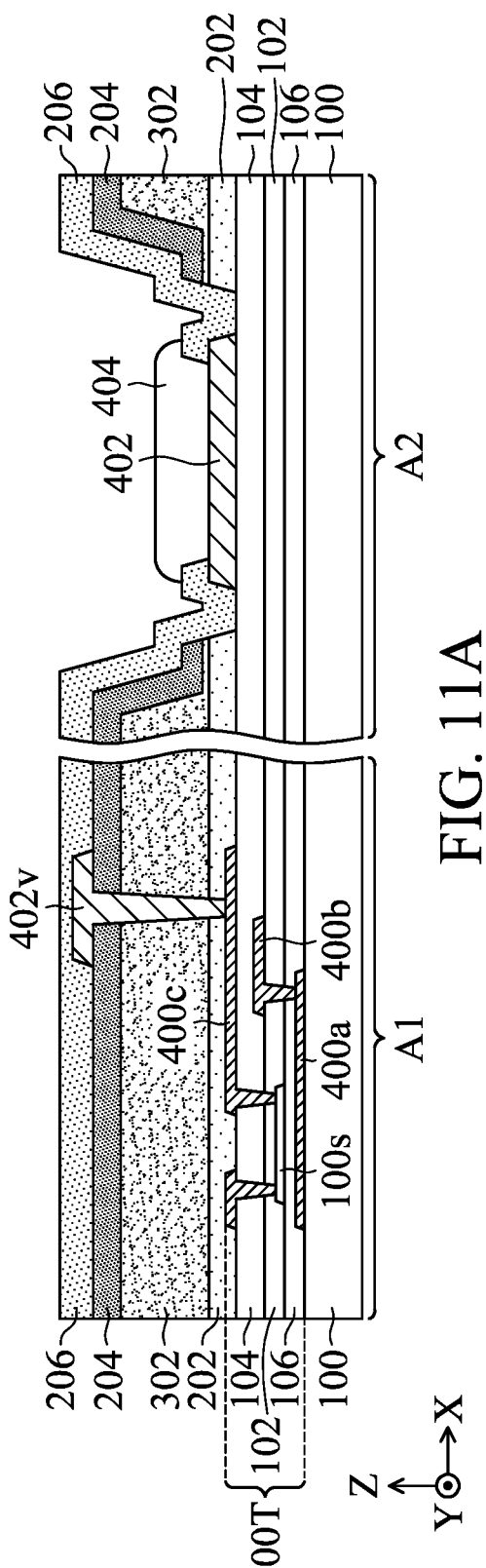
Figure 11B:
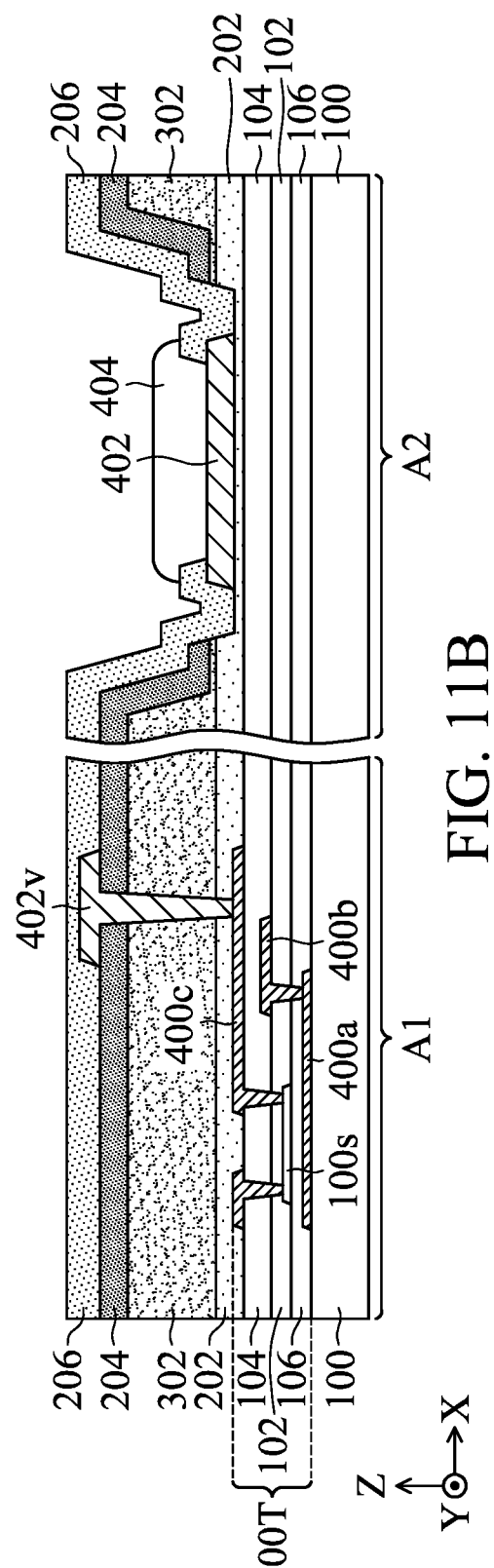

Next, refer to FIG. 11A and FIG. 11B. FIG. 11A and FIG. 11B respectively follow the steps shown in FIG. 10A and FIG. 10B. As shown in FIG. 11A and FIG. 11B, after the bonding pad 402 is formed, a third passivation layer 206 may be formed on the second passivation layer 204 and the bonding pad 402. In addition, a portion of the third passivation layer 206 may be removed to expose a part of the bonding pad 402, for example, to expose a portion of the top surface of the bonding pad 402. Then, a solder pad 404 may be formed on the bonding pad 402. The solder pad 404 may cover the exposed bonding pad 402 and be electrically connected to the bonding pad 402. In accordance with some embodiments, the solder pad 404 may partially cover the third passivation layer 206.

In accordance with some embodiments, the method for forming the third passivation layer 206 may be the same as or similar to the process for forming the first passivation layer 202 or the second passivation layer 204, and thus will not be repeated here. In accordance with some embodiments, the solder pad 404 may be formed by a chemical vapor deposition process, a physical vapor deposition process, an electroplating process, an electroless plating process, another suitable process, or a combination thereof.

Next, an electronic component 500 may be bonded to the bonding pad 402.

Specifically, in accordance with some embodiments, as shown in FIG. 1 or FIG. 2, the electronic component 500 may then be bonded to the solder pad 404 on the bonding pad 402 by a solder material 406. Furthermore, the electronic device formed by the steps shown in FIGS. 5 to 8, FIG. 9A, FIG. 10A and FIG. 11A will have a similar structure to that shown in FIG. 1. The electronic device formed by the steps shown in FIGS. 5 to 8, FIG. 9B, FIG. 10B and FIG. 11B will have a similar structure to that shown in FIG. 2.

Figure 12A:
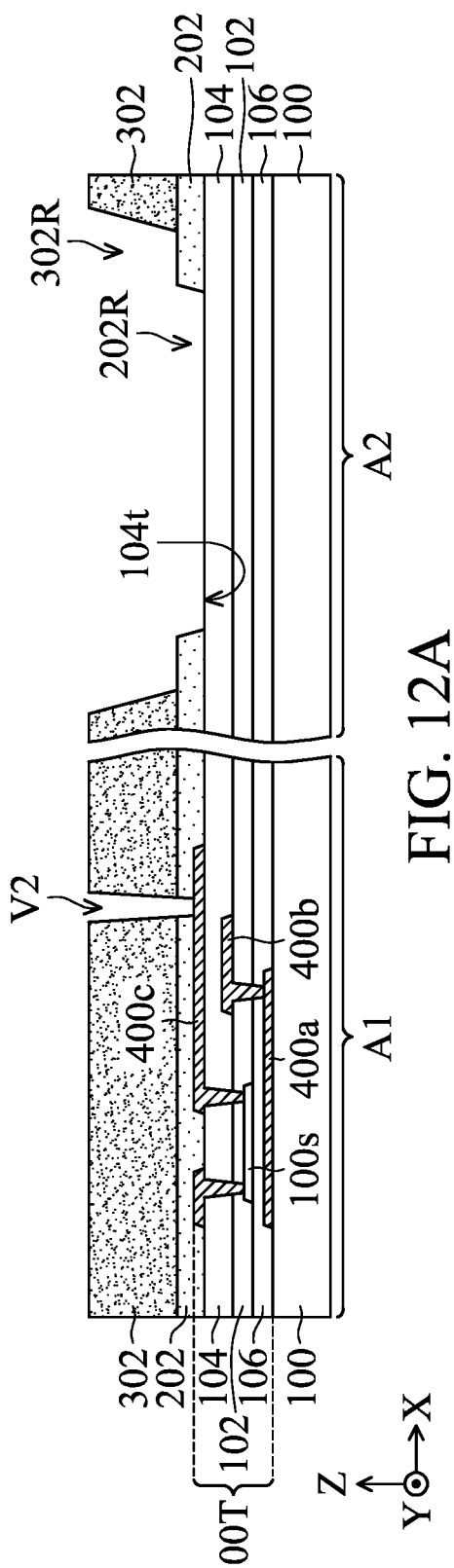
FIG. 12A and FIG. 12B are cross-sectional diagrams of an electronic device during different process stages in accordance with some embodiments of the present disclosure.
Figure 12B:
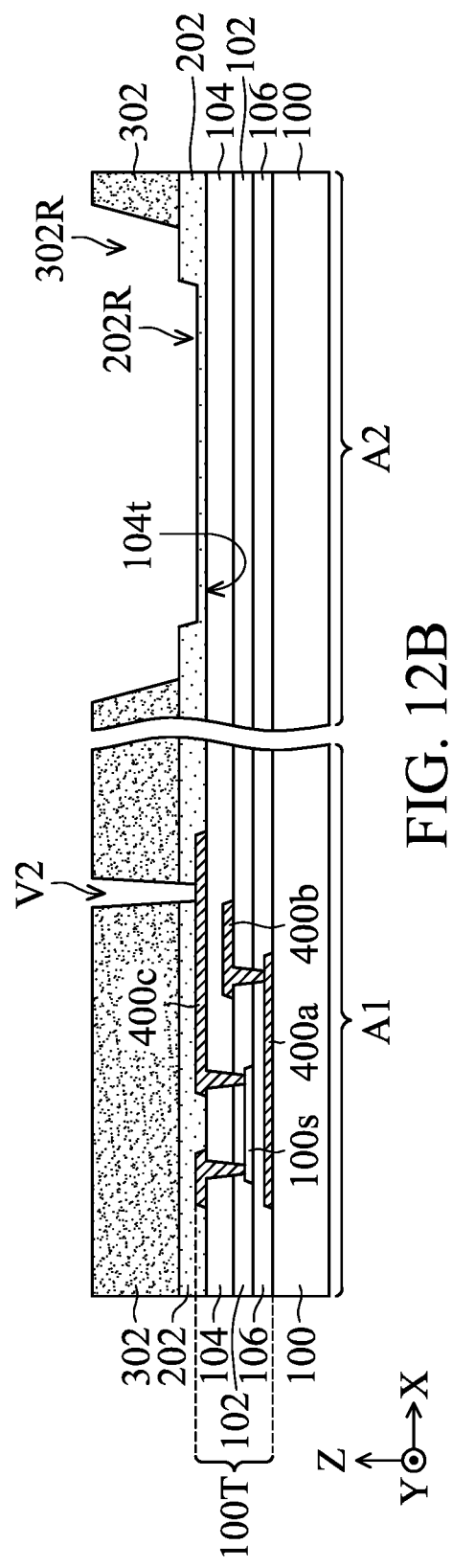

Refer to FIG. 12A and FIG. 12B, which are cross-sectional diagrams of an electronic device during different process stages in accordance with some other embodiments of the present disclosure. Specifically, FIG. 12A and FIG. 12B can follow the step shown in FIG. 7. According to the embodiments shown in FIG. 12A and FIG. 12B, the step of forming the second passivation layer 204 on the substrate 100 is performed after the step of patterning the first passivation layer 202. In contrast, according to the embodiments shown in FIG. 9A and FIG. 9B, the step of forming the second passivation layer 204 on the substrate 100 is performed before the step of patterning the first passivation layer 202.

Specifically, as shown in FIG. 12A, in accordance with some embodiments, after the organic layer 302 is patterned to expose the region 302R, the first passivation layer 202 may then be patterned to expose the region 202R, and the region 202R may be the top surface 104t of the second insulating layer 104 of the thin-film transistor layer 100T. In detail, the first passivation layer 202 may be patterned by one or more photolithography processes and/or etching processes, and a portion of the first passivation layer 202 may be removed to expose the top surface 104t of the second insulating layer 104.

In accordance with some embodiments, during the step of patterning the first passivation layer 202 in the bonding area A2 to expose the region 202R is performed, a portion of the first passivation layer 202 may also be removed by one or more photolithography processes and/or etching processes to form a through-hole V2 in the circuit area A1, and the through-hole V2 may expose a portion of the conductive layer 400c.

On the other hand, as shown in FIG. 12B, in accordance with some other embodiments, after the organic layer 302 is patterned to expose the region 302R, the first passivation layer 202 may then be patterned to expose the region 202R, the region 202R may be a recess of the first passivation layer 202. Specifically, the first passivation layer 202 may be patterned by one or more photolithography processes and/or etching processes, a portion of the first passivation layer 202 may be removed, and a recess may be formed in the first passivation layer 202. As shown in FIG. 12B, in this embodiment, the patterned first passivation layer 202 is still disposed on the top surface 104t of the second insulating layer 104, and the patterning process does not expose the top surface 104t of the second insulating layer 104.

Similarly, in this embodiment, during the step of patterning the first passivation layer 202 in the bonding area A2 to expose the region 202R is performed, a portion of the first passivation layer 202 may also be removed by one or more photolithography processes and/or etching processes to form a through-hole V2 in the circuit area A1, and the through-hole V2 may expose a portion of the conductive layer 400c.

Following the steps shown in FIG. 12A and FIG. 12B, the second passivation layer 204 may then be formed on the organic layer 302, the first passivation layer 202, and the second insulating layer 104 (for FIG. 12). In addition, the second passivation layer 204 may also be filled in the through-hole V2. Then, the second passivation layer 204 in the through-hole V2 may be removed, and a conductive material may be formed on the second passivation layer 204 and in the through-hole V2. The aforementioned conductive material then may be patterned by one or more photolithography processes and/or etching processes to form the bonding pad 402 and the via 402v. After that, the steps of FIG. 10A, FIG. 10B, FIG. 11A, and FIG. 11B can be referred to accordingly. Furthermore, the electronic device formed by the steps shown in FIG. 12A and FIG. 12B will have structures similar to those shown in FIG. 3 and FIG. 4, respectively.

To summarize the above, in accordance with the embodiments of the present disclosure, a method of manufacturing an electronic device is provided, which can improve the structural strength of the junction between the bonding pad and the electronic component in the electronic device that is formed. For example, the risk of cracks in the substrate or peeling of the electronic component from the substrate can be reduced, thereby improving the overall reliability of the electronic device.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. An electronic device, comprising:
   a substrate;
   a thin-film transistor layer disposed on the substrate;
   a first passivation layer disposed on the thin-film transistor layer, wherein the first passivation layer has a first portion and a second portion, the first portion is an opening or a recess, and the second portion is adjacent to the first portion;
   an organic layer disposed on the first passivation layer, wherein the organic layer has an opening;
   a second passivation layer disposed on the organic layer;
   a bonding pad disposed on the thin-film transistor layer, wherein the bonding pad corresponds to an overlapping area of the first portion of the first passivation layer and the opening of the organic layer; and
   an electronic component bonded to the bonding pad, wherein the first passivation layer does not overlap with the bonding pad, the bonding pad is in continuous contact with the thin-film transistor layer, and a first distance between an edge of the first passivation layer and an edge of the bonding pad is greater than or equal to 5 micrometers and less than or equal to 100 micrometers, wherein the bonding pad is in direct contact with the first passivation layer.

2. The electronic device as claimed in claim 1, wherein a thickness of the first portion is smaller than a thickness of the second portion.

3. The electronic device as claimed in claim 1, wherein the difference between a thickness of the first portion and a thickness of the second portion is greater than or equal to 0.01 micrometers and less than or equal to 5 micrometers.

4. The electronic device as claimed in claim 1, wherein the first portion comprises a contact region and a non-contact region, the contact region is in contact with the bonding pad, the non-contact region surrounds the contact region, and a distance between the edge of the bonding pad and an outer edge of the non-contact region is greater than or equal to 5 micrometers and less than or equal to 100 micrometers.

* * * * *